(12) United States Patent
Xiao et al.

(10) Patent No.: US 10,983,182 B2
(45) Date of Patent: Apr. 20, 2021

(54) ULTRASENSITIVE MAGNETIC TUNNELING JUNCTION SENSOR

(71) Applicant: BROWN UNIVERSITY, Providence, RI (US)

(72) Inventors: Gang Xiao, Barrington, RI (US); Guanyang He, Providence, RI (US)

(73) Assignee: Brown University, Providence, RI (US)

( * ) Notice: Subject to any disclaimer, the term of this patent is extended or adjusted under 35 U.S.C. 154(b) by 0 days.

(21) Appl. No.: 16/537,115

(22) Filed: Aug. 9, 2019

(65) Prior Publication Data

US 2020/0049775 A1 Feb. 13, 2020

Related U.S. Application Data

(60) Provisional application No. 62/717,469, filed on Aug. 10, 2018.

(51) Int. Cl.
| | | |
|---|---|---|
| G01R 33/09 | (2006.01) | |
| H01F 10/32 | (2006.01) | |
| H01F 41/34 | (2006.01) | |
| H01L 43/10 | (2006.01) | |
| H01L 43/12 | (2006.01) | |
| H01L 43/02 | (2006.01) | |

(52) U.S. Cl.
CPC ....... *G01R 33/098* (2013.01); *H01F 10/3259* (2013.01); *H01F 41/34* (2013.01); *H01L 43/02* (2013.01); *H01L 43/10* (2013.01); *H01L 43/12* (2013.01)

(58) Field of Classification Search
CPC .. H01F 10/324; H01F 10/3281; H01F 41/303; H01F 41/32; H03M 2201/818
See application file for complete search history.

(56) References Cited

U.S. PATENT DOCUMENTS

| | | | |
|---|---|---|---|
| 2011/0027901 A1* | 2/2011 | Gaster | G01N 27/745 436/149 |
| 2011/0062956 A1* | 3/2011 | Edelstein | G01R 33/0286 324/251 |
| 2016/0126452 A1* | 5/2016 | Kuo | H01L 43/08 257/421 |
| 2018/0275216 A1* | 9/2018 | Tanaka | G01R 33/098 |

OTHER PUBLICATIONS

Almeida, et al., "Field Detection in Mgo Magnetic Tunnel Junctions With Superparamagnetic Free Layer and Magnetic Flux Concentrators", Journal of Applied Physics, vol. 105, Issue 7, 2009, 07E722 pages.

(Continued)

*Primary Examiner* — Zandra V Smith
*Assistant Examiner* — Andre C Stevenson
(74) *Attorney, Agent, or Firm* — Adler Pollock & Sheehan P.C.

(57) ABSTRACT

A magnetic tunneling junction sensor includes a free ferromagnetic layer of material, a pinned ferromagnetic layer of material, the free ferromagnetic layer and the pinned ferromagnetic layer separated by a thin insulating layer of material through which electrons can tunnel, an oxidized silicon wafer, the free ferromagnetic layer, thin insulating layer and the pinned ferromagnetic layer deposited on the oxidized silicon wafer, and extrinsic magnetic flux.

9 Claims, 6 Drawing Sheets

(56) References Cited

OTHER PUBLICATIONS

Cao, et al., "Magnetic Anisotropy Properties of Cozrnb Thin Films Deposited on Pet Substrate by Magnetron Sputtering", Journal of Magnetism and Magnetic Materials, vol. 324, Issue 10, May 2012, pp. 1832-1836.(English Abstract Only).
Caruso, et al., "In Vivo Magnetic Recording of Neuronal Activity", Neuron, vol. 95, Issue 6, Sep. 13, 2017, pp. 1283-1291.(English Abstract Only).
Chaves, et al., "Low frequency picotesla field detection using hybrid MgO based tunnel sensors", Applied Physics Letters, vol. 91, Issue 10, 2007, 102504 pages.
Choi, et al., "Comparison of the Soft Magnetic Properties of Permalloy and Conetic Thin Films", Journal of Magnetism and Magnetic Materials, vol. 322, Issue 15, Aug. 2010, pp. 2191-2194. (English Abstract Only).
Drljač, et al., "Design of Planar Magnetic Concentrators for High Sensitivity Hall Devices", Sensors and Actuators A: Physical, vols. 97-98, Apr. 1, 2002, pp. 10-14.(English Abstract Only).
Egelhoff, et al., "Critical Challenges for Picotesla Magnetic-tunnel-junction Sensors", Sensors and Actuators A: Physical, vol. 155, Issue 2,, Oct. 2009, pp. 217-225.(English Abstract Only).
Ferreira, et al., "Tuning of Mgo Barrier Magnetic Tunnel Junction Bias Current for Picotesla Magnetic Field Detection", Journal of applied physics, vol. 99, Issue 8, Apr. 27, 2006, 08K706 pages.
Freitas, et al., "Magnetoresistive sensors", Journal of Physics: Condensed Matter, vol. 19, Issue 16, Apr. 6, 2007, 165221 Pages. (English Abstract Only).
Freitas, et al., "Spin Dependent Tunnel Junctions for Memory and Read-head Applications", IEEE Transactions on Magnetics, vol. 36, Issue 5, Sep. 2000, pp. 2796-2801.(English Abstract Only).
Guedes, et al., "Improving Magnetic Field Detection Limits of Spin Valve Sensors Using Magnetic Flux Guide Concentrators", IEEE Transactions on Magnetics, vol. 43, Issue 6, Jun. 2007, pp. 2376-2378.(English Abstract Only).
Ikeda, et al., "Magnetic Tunnel Junctions for Spintronic Memories and Beyond", IEEE Transactions on Electron Devices, vol. 54, Issue 5, May 2007, pp. 991-1002.
Lau, et al., "Magnetic Nanostructures for Advanced Technologies: Fabrication, Metrology and Challenges", Journal of Physics D: Applied Physics, vol. 44, Issue 30, article id. 303001, Aug. 2011, 43 pages.(English Abstract Only).
Li, et al., "Thickness-dependent Magnetization Reversal in Cozrnb Amorphous Films", Journal of Magnetism and Magnetic Materials, vol. 315, Issue 2, Aug. 2007, pp. 120-125.(English Abstract Only).
Lima, "Scanning Magnetic Tunnel Junction Microscope for High-resolution Imaging of Remanent Magnetization Fields", Measurement Science and Technology, vol. 25, Issue 10, 2014, 105401 pages.
Liou, et al., "Picotesla Magnetic Sensors for Low-frequency Applications", IEEE Transactions on Magnetics, vol. 47, Issue 10, Oct. 2011, 3740.
Marinho, et al., "Three Dimensional Magnetic Flux Concentrators With Improved Efficiency for Magnetoresistive Sensors", Journal of Applied Physics, vol. 109, Issue 7, 2011, 07E521 pages.
Mazumdar, et al., "Field Sensing Characteristics of Magnetic Tunnel Junctions With (001) MgO Tunnel Barrier", Journal of Applied Physics, vol. 103, Issue 11, 2008, 113911 pages.
Mazumdar, et al., "Low Frequency Noise in Highly Sensitive Magnetic Tunnel Junctions With (001) MgO Tunnel Barrier", Applied Physics Letters, vol. 91, Issue 3, 2007, 033507 pages.
Mazumdar, et al., "Thermal Stability, Sensitivity, and Noise Characteristics of Mgo-based Magnetic Tunnel Junctions", Journal of Applied Physics, vol. 101, Issue 9, 2007, 09B502.
Miura, et al., "Annealing behavior of magnetic anisotropy in CoNbZr films", IEEE Transactions on Magnetics, vol. 24, Issue 5, Sep. 1988, pp. 2215-2220.(English Abstract Only).
Nabighian, et al., "The Historical Development of the Magnetic Method in Exploration", Geophysics, vol. 70, Issue 6, (Nov.-Dec.) 2005, 33ND-61ND.
Park, et al., "Magnetic Tunnel Junctions With Low Ms Free Layers", Physica Status Solidi (A) Applied Research, vol. 201, Issue 8, Jun. 1, 2004, pp. 1640-1643.(English Abstract Only).
Schrag, et al., "International Symposium for Testing and Failure Analysis", ISTFA 2006 : proceedings of the 32nd International Symposium for Testing and Failure Analysis,, Nov. 12-16, 2006, 524 pages. (English Abstract Only).
Shen, et al., "In Situ Detection of Single Micron-sized Magnetic Beads Using Magnetic Tunnel Junction Sensors", Applied Physics Letters, vol. 86, Issue 25, 2005, 253901 pages.
Shen, et al., "Laser Induced Popcornlike Conformational Transition of Nanodiamond as a Nanoknife", Applied Physics Letters, vol. 93, Issue 3, 2008, 033905 pages.
Stutzke, et al., "Low-frequency noise measurements on commercial magnetoresistive magnetic field sensors", Journal of Applied Physics, vol. 97, Issue 10, May 18, 2005, 10Q107 pages.
Takahashi, et al., "Annealing Dependence of Coercivity, Anisotropy Field, and Resistivity for Amorphous Cozrnb Films Deposited by Dc Planar Magnetron Sputtering", Journal of Applied Physics, vol. 69, Issue 8, 1991, 5011 pages.(English Abstract Only).
Takahashi, et al., "Japanese journal of applied physics", JJAP. Part. 1, vol. 28, Issue 3, Mar. 1989, 379 pages.
Wisniowski, et al., "1/f Magnetic Noise Dependence on Free Layer Thickness in Hysteresis Free MgO Magnetic Tunnel Junctions", IEEE Transactions on Magnetics, vol. 44, Issue 11, Nov. 2008, pp. 2551-2553.(English Abstract Only).
Wusheng, et al., "Design of Underground Sonde of a Directional Drilling Locator System", Sensors and Actuators A: Physical, vol. 119, Issue 2, Apr. 13, 2005, pp. 427-432.(English Abstract Only).
Yin, "Spintronics VIII", Proceedings of SPIE,vol. 9551, Sep. 28, 2015.(English Abstract Only).
Zhang, et al., "Low-frequency Noise in Serial Arrays of Mgo-based Magnetic Tunnel Junctions", Physical Review B, vol. 84, Issue 9, Sep. 27, 2011, 094446 pages.(English Abstract Only).
Zhu, et al., "Magnetic Tunnel Junctions", Materials today, vol. 9, Issue 11, Nov. 2006, pp. 36-45.
Zutic, et al., "Handbook of Spin Transport and Magnetism", Apr. 19, 2016, 808 pages.(English Abstract Only).

* cited by examiner

ULTRASENSITIVE MAGNETIC TUNNELING JUNCTION SENSOR

CROSS REFERENCE TO RELATED APPLICATIONS

This application claims benefit from U.S. Provisional Patent Application Ser. No. 62/717,469, filed Aug. 10, 2018, which is incorporated by reference in its entirety.

STATEMENT REGARDING GOVERNMENT INTEREST

This invention was made with government support under Grant No. DMR-1307056 awarded by the National Science Foundation. The government has certain rights in the invention.

BACKGROUND OF THE INVENTION

The present invention relates generally to magnetic sensors, and specifically to an ultrasensitive magnetic tunneling junction sensor.

Ultra-sensitive solid-state magnetic sensors are in strong demand in many applications where currently available sensors are inadequate. One option is the use of a magnetic tunneling junction, In general, a magnetic tunneling junction (MTJ) is a device that includes two ferromagnetic electrodes separated by a thin insulating layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic electrodes. The two ferromagnetic electrodes are designed to have different responses to magnetic fields so that the relative orientation of their moments can be varied with an external magnetic field.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In general, in one aspect, the invention features a magnetic tunneling junction sensor including a free ferromagnetic layer of material, a pinned ferromagnetic layer of material, the free ferromagnetic layer and the pinned ferromagnetic layer separated by a thin insulating layer of material through which electrons can tunnel, an oxidized silicon wafer, the free ferromagnetic layer, thin insulating layer and the pinned ferromagnetic layer deposited on the oxidized silicon wafer, and extrinsic magnetic flux concentrators that amplify external magnetic fields.

In another aspect, the invention features a method including depositing a bottom ferromagnetic layer on an oxidized silicon wafer using magnetron sputtering, depositing an insulating layer on the bottom ferromagnetic layer using magnetron sputtering, depositing a top ferromagnetic layer on the insulating layer using magnetron sputtering, adding a pattern using photolithography, and adding a pair of magnetic flux concentrators.

Embodiments of the invention may include one or more of the following advantages.

The present invention can achieve a magnetic field sensitivity of about 30 picoTesla ($30*10^{-12}$ Tesla). This is significant for future applications.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

These and other features, aspects, and advantages of the present invention will become better understood with reference to the following description, appended claims, and accompanying drawings where:

DETAILED DESCRIPTION

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention is a method of incorporating an on-the-chip magnetic flux concentrator (onMFC) and an external magnetic flux concentrator (exMFC) on a magnetic tunneling junction (MTJ) sensor that is on a piece of silicon (square 1×1 mm$^2$). The double staged MFCs have an amplification factor of 517.

The present invention provides robust and easy-to-use MTJ sensors with picoTesla field sensitivity by researching on extrinsic magnetic flux concentrators (MFCs), that amplifies external magnetic fields. The MFCs include two stages, on-chip MFC (onMFC) and external MFC (exMFC). The invention includes a design and processing of two types of "soft" magnetic materials with high permeability and low coercivity (Hc), a thin film for the onMFC and a bulk alloy for exMFC. The present invention achieves a flux amplification of a few hundred-fold, and picoTesla (pT)-scale field sensitivity over a broad frequency range up to 100 kHz.

Highly sensitive magnetic sensors rely on the fabrication of high quality MTJ wafer stacks, which are by using a high vacuum magnetron sputtering system with a base pressure of 2×10$^{-8}$ Torr. The MTJ stacks are deposited on 2-inch thermally oxidized silicon wafers according to the layer sequence of Si-substrate/SiO$_2$/Ta(50)/Ru(300)/Ta(50)/Co$_{50}$Fe$_{50}$ (30)/Ir$_{22}$Mn$_{78}$ (180)/Co$_{50}$Fe$_{30}$(30)/Ru(8.5)/Co$_{40}$Fe$_{40}$B$_{20}$(30)/MgO(25)/Co$_{40}$Fe$_{40}$B$_{20}$(25)/Ta (3)/Conetic (400)/Ta (50)/Ru(100) (numbers referring to thickness in Angstroms). The MgO tunneling layer is deposited under 1.2 mTorr Ar sputtering pressure and 120 W RF power, and all other layers under 2 mTorr and DC sputtering with various power. The bottom CoFeB below the MgO barrier is a magnetically fixed layer and the top CoFeB/Ta/Conetic composite layer is the magnetic free layer. The Conetic® layer is a soft ferromagnetic alloy with a composition of Ni$_{77}$Fe$_{14}$Cu$_5$Mo$_4$, which is similar to but softer than a nickel iron magnetic alloy. Photolithography and physical ion milling are used to pattern the stacks into hundreds of magnetic sensor units on each wafer.

Figure 1A:
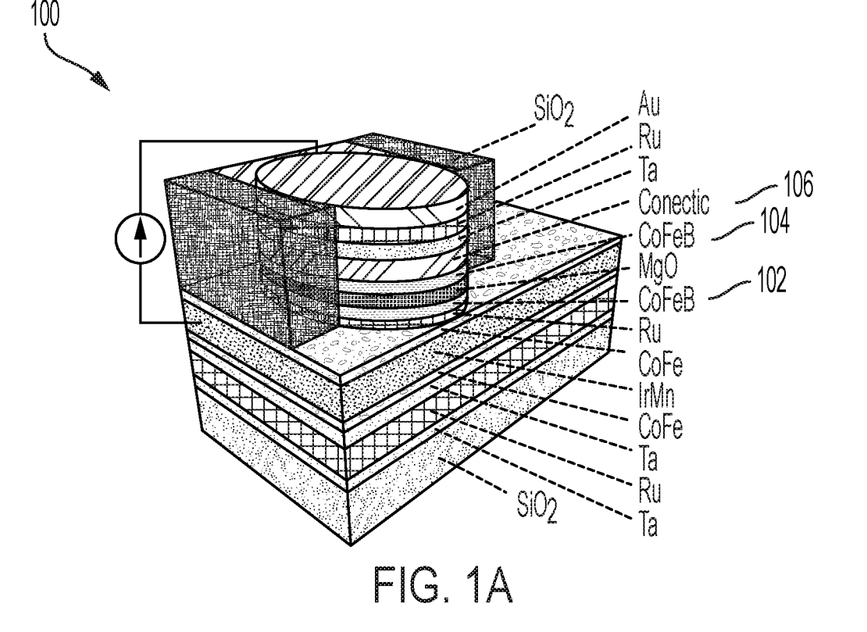
FIG. 1A is an exemplary schematic of an entire MTJ layer structure and patterned oval MTJ etched to a bottom of a pinned CoFeB layer.

FIG. 1A is a schematic of an exemplary individual MTJ layer structure and patterned oval MTJ 100 etched to a bottom of a pinned CoFeB layer 102. Ellipse long axis=120 µm and short axis=15 µm (aspect ratio 8). Pinning is along the short axis, which is also the sensing direction. The magnetization of the top "free" composite layer, CoFeB/Conetic 104/106, is along the long axis due to shape anisotropy.

Figure 1B:
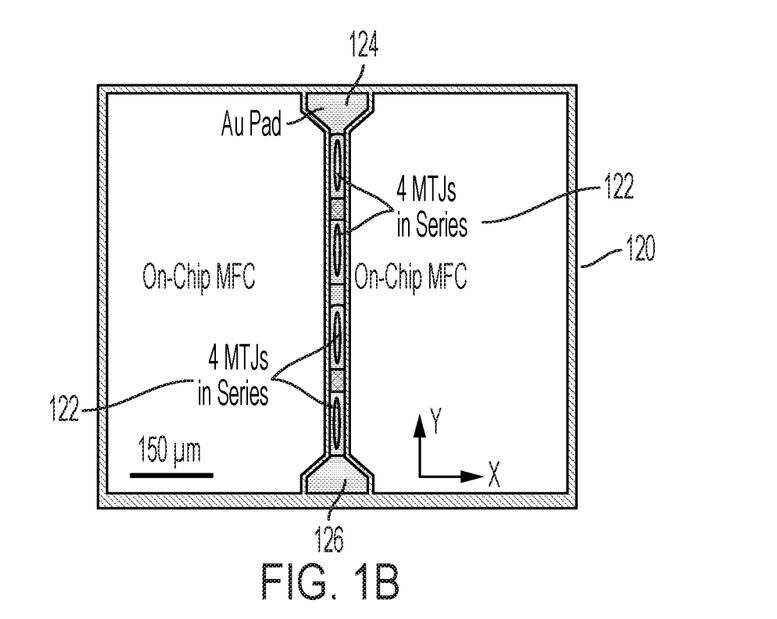
FIG. 1B is an exemplary micrograph of an MTJ sensor unit having four MTJs connected in series along the central y-axis and a pair of trapezoid-shaped on-chip flux concentrators made of CoZrNb film.

More specifically, a fabrication process subjected the wafer 100 to a magnetic annealing process at 320° C. for 2 hours in a high vacuum of 6×10$^{-7}$ Torr and under an in-plane field of 0.45 T. As shown in FIG. 1B, one sensor unit (a die) 120 has a silicon footprint of 1×1 mm$^2$, including four MTJs 122 connected in series. Each MTJ 122 has an oval shape with a dimension of 15×120 pmt. The sensor 120 is a two-terminal resistor-like device with a typical resistance of 2.5 kΩ and a total MR of about 95% between parallel and antiparallel magnetization configuration of the bottom and top magnetic electrodes. The field sensing direction is along the x-axis which is the shorter axis of the MTJ ellipse. Two gold pads 124, 126 along the central y-axis serve as the two terminals of the MTJ sensor 120.

As described above, the MFCs include two stages, on-chip MFC (onMFC) stage and external MFC (exMFC) stage. As shown in FIG. 1B, the first stage onMFC includes a pair of trapezoids made of Co$_{88}$Zr$_4$Nb$_8$(CoZrNb) film which is deposited/patterned in close proximity to the MTJ sensor unit. A central gap between the two onMFCs is 30 µm, and the external field in the sensing direction is amplified within the gap. CoZrNb is a soft magnetic material with a high permeability µ varying from 1000 to 7000. It is an excellent MFC material for solid-state magnetic sensors. We deposited CoZrNb amorphous thin film using a 99.95%-purity sputtering target. To optimize its growth condition, we first deposited CoZrNb film on oxidized silicon wafers and measured its magnetic properties using Vibrating Sample Magnetometry (VSM). In preferred embodiment, we obtained the best sputtering conditions for optimized "soft" magnetic properties (high permeability and low coercivity): base vacuum pressure 1.8×10$^{-7}$ Torr; Ar gas sputtering pressure 5.0×10$^{-4}$ Torr; DC sputtering power 100 W; CoZrNb film thickness 1200 nm. Purity of the material, high vacuum level, moderate sputtering power, as well as low sputtering pressure seem to be necessary to obtain "softness" of CoZrNb.

Figure 1C:
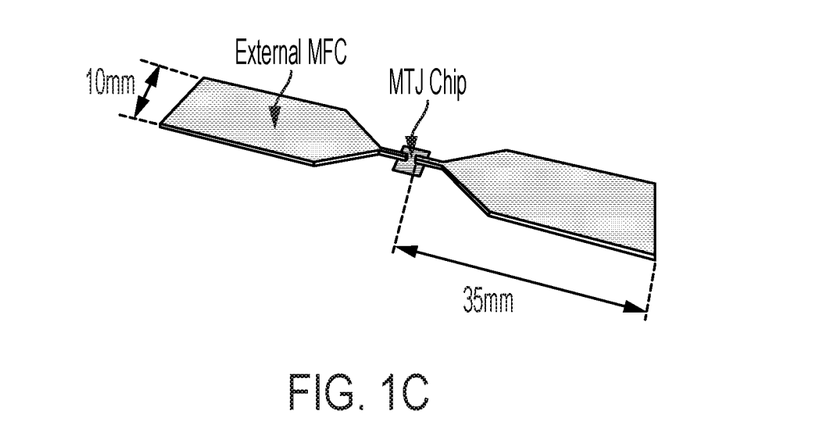
FIG. 1C is an exemplary schematic of a pair of external magnetic flux concentrators (e.g., Conetic alloy) with two tips in contact with the on-chip MFC.

FIG. 1C is an exemplary schematic of a pair of external magnetic flux concentrators (e.g., Conetic alloy) with two tips in contact with the on-chip MFC.

Figure 2A:
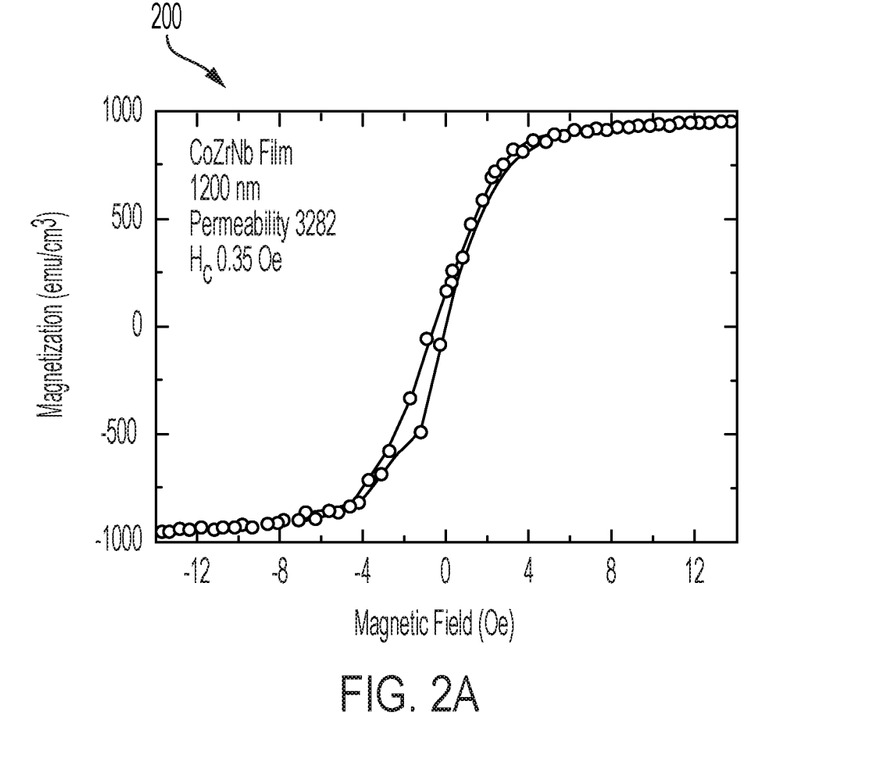
FIG. 2A is an exemplary magnetic hysteresis loop of sputtered CoZrNb film with a thickness of 1200 nm at 300 K.

FIG. 2A shows an exemplary graph 200 representative magnetic hysteresis loop for a 1200 nm-thick CoZrNb film. The saturation magnetization is about 950 emu/cm$^3$. The saturation field is about 4 Oe and H$_c$=0.35 Oe. Magnetic permeability is 3282.

Figure 2B:
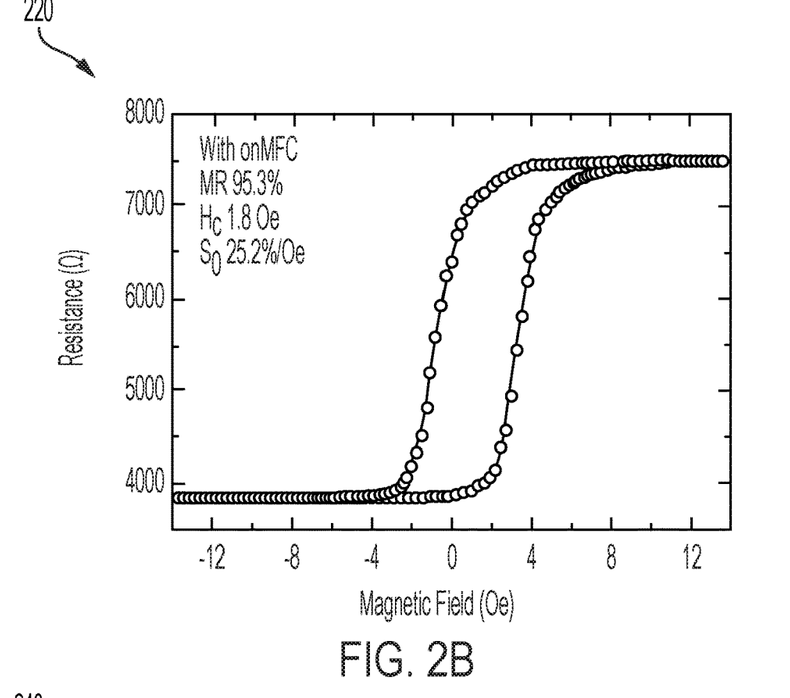
FIG. 2B is an exemplary resistance transfer curve of an MTJ sensor with integrated on-chip magnetic flux concentrators (onMFC) comprised of the CoZrNb film.

Patterning the continuous CoZrNb film into onMFC has the tendency to increase the Hc. The edges and the associated roughness, as well as the trapezoid shape, are some of the factors in affecting the Hc. FIG. 2B is an exemplary graph 220 of a linear transfer curve (resistance versus sensing field) of a representative MTJ sensor with onMFC within ±14 Oe. The coercive field is HC=1.8 Oe. The magnetic field sensitivity S$_0$ is defined as $$S_0 = \frac{1}{R_0}\frac{\Delta R}{\Delta H}$$

where R$_0$ is the center resistance on the transition curves. One can provide a biasing magnetic field to keep the sensor at the R$_0$ state, where it has the highest resistance slope of ΔR/ΔH. For the sensor used for FIG. 2B, S$_0$'=25.2%/Oe. As a comparison, the MTJ sensor without onMFC carries a typical sensitivity S0 of 1.5%/Oe. Therefore, the amplification factor for the onMFC is β1=S$_0$'/S$_0$=16.8.

As shown in FIG. 1C, the second stage exMFC is a pair of "macroscopic" flux concentrators. In a preferred embodiment, we use bulk metallic sheet (0.5 mm thick) of Conetic® alloy (Ni$_{77}$Fe$_{14}$Cu$_8$Mo$_4$) that is annealed by the manufacturer and carries a permeability of 18.8. Each concentrator is shaped as a rectangle with one end reduced into a tip. The width of the rectangle and the tip is 10 mm and 1 mm, respectively. The overall length of the concentrator is 35 mm. We integrate the two concentrators with their tips facing the microscopic MTJ sensor, and the gap between the two tips is about 0.8 mm. The tips are carefully placed onto the onMFC to avoid any air gap between the onMFC and the exMFC, therefore, reducing the magnetic flux "resistance."

Figure 2C:
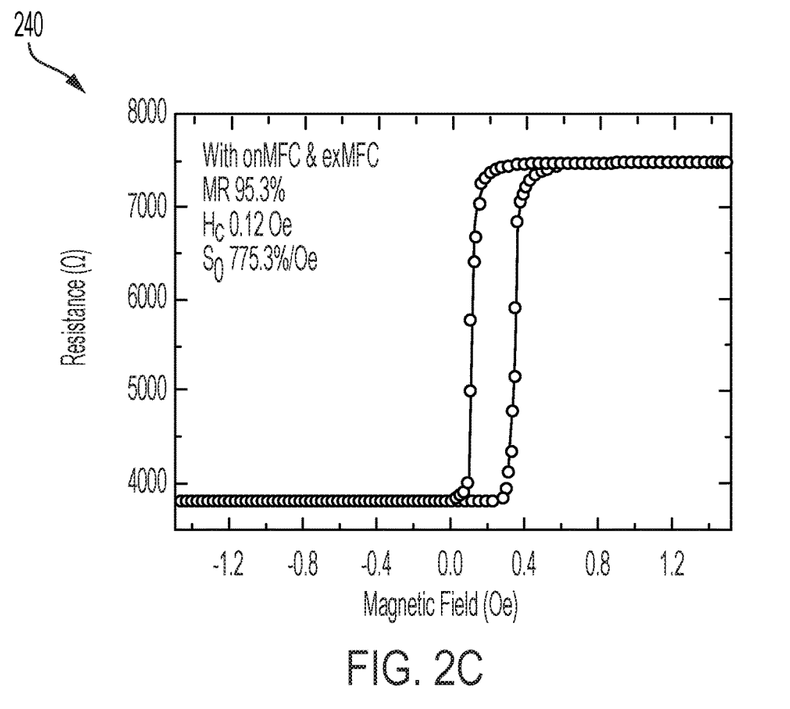
FIG. 2C is an exemplary resistance transfer curve of an MTJ sensor with dual MFCs (onMFC and exMFC).

FIG. 2C illustrates an exemplary graph 240 of a linear transfer curve of a representative MTJ sensor with double-staged onMFC and exMFC. The field sensitivity is enhanced to S$_0$"=775.3%/Oe, implying the second stage exMFC sports an amplification factor of β$_2$=S$_0$"/S$_0$'=30.8. The total amplification factor is β=β$_1$ β$_2$=516.9. The sensor carries a small coercivity of only 0.12 Oe. Our double-staged MFCs generate an extremely large sensitivity, but the field dynamic range is reduced significantly. Each sensing edge is saturated within a narrow field range of only 0.1 Oe. For the sensor to operate effectively, we need to field-bias the sensor at the R0 state under an ambient environment, e.g., the Earth's magnetic field.

Figure 3A:
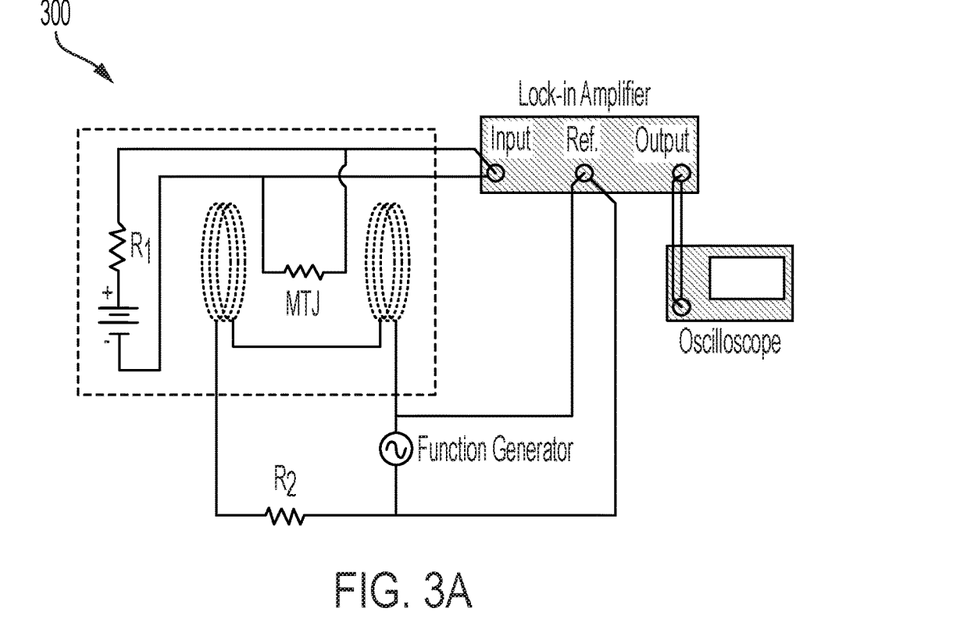
FIG. 3A is an exemplary experimental setup in measuring a voltage signal and noise level of MTJ sensors.

Measurements herein are done directly under picoTesla magnetic fields and we characterize completely the detectable field limit, the frequency response, and the intrinsic noise of our MTJ sensor. An exemplary experimental setup 300 is illustrated in FIG. 3A. Two AAA-batteries in series with a resistor $R_1$ constitutes a DC bias current source, applying approximately 1.5 V bias voltage on the MTJ sensor. A function generator (e.g., Agilent® 33220A) is connected in series with a pair of calibrated coils near the sensor and a current-limiting resistor $R_2$, to generate a AC testing magnetic field. One additional coil (not shown) is used to apply a DC biasing field so that the sensor is maintained at the $R_0$ state. Voltage signal across the sensor is fed into a lock-in amplifier, which has a negligible FET-input voltage noise of 5nV/√Hz.

During measurement the low-pass filter of the lock-in amplifier output is set with a time constant of 5s and a slope of 24 dB/octave, corresponding to an equivalent noise bandwidth of 0.024 Hz.

Upon an AC testing magnetic field at certain amplitude is applied, the oscilloscope in FIG. 3A records stabilized output of the lock-in amplifier for 100s. The mean value of the recorded output corresponds to sensor's voltage signal in response to the testing field, and its fluctuation, i.e., standard deviation, represents the noise level of the sensor.

Figure 3B:
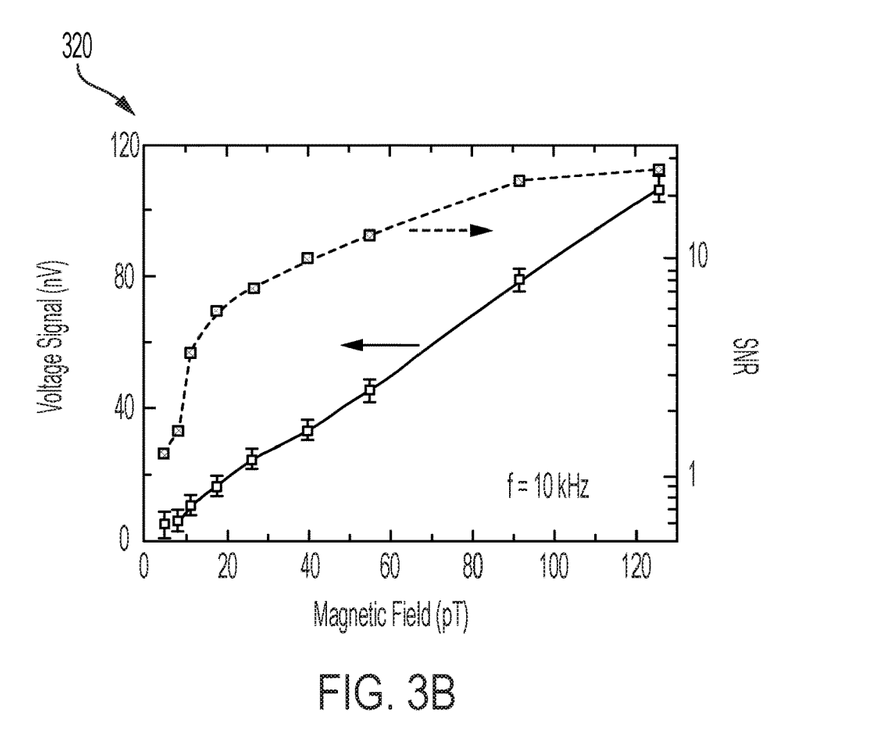
FIG. 3B is an exemplary graph of a voltage signal and SNR measured by the lock-in amplifier as a function of the amplitude of the testing AC magnetic field at 10 kHz.

FIG. 3B illustrates an exemplary graph 320 of a voltage signal and the signal-to-noise ratio (SNR) as a function of the amplitude of the AC testing field at 10 kHz. As the amplitude is reduced from 213 to 5 pT, SNR drops to approximately 1, which reveals the detection limit of 5 pT at 10 kHz.

Figure 3C:
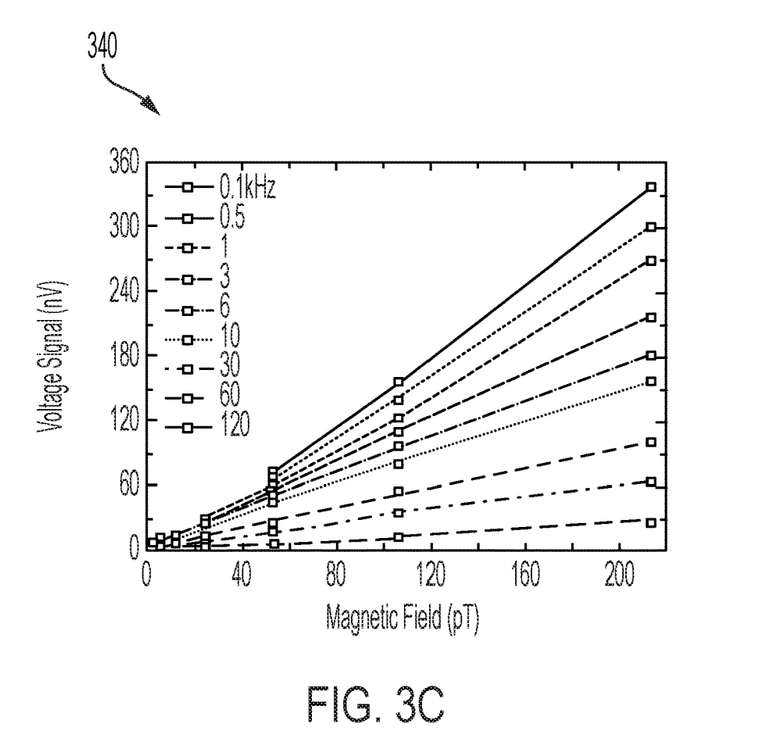
FIG. 3C is an exemplary graph of a voltage signal measured at different frequencies.

Both the sensor's signal and noise can depend on the frequency of the testing magnetic field, so it is important to determine the detectable field limit under different frequencies. FIG. 3C illustrates an exemplary graph 340 of voltage signals of the MTJ sensor from 0.1 to 120 kHz. At each frequency, we gradually reduce the amplitude of the testing magnetic field until the SNR reaches 1. At all frequencies, voltage signal of such sensors scales linearly with magnetic field, yet this response (slope of the line) decreases with increasing frequency. The soft magnetic materials of MFCs become less responsive for higher frequency, as their permeability goes down. This is, in part, due to eddy currents in MFCs. Moreover, the detectable field limit is getting large at low frequency despite the increment in sensor response, indicating the noise level has strong frequency dependence.

To see this more clearly, we have calculated the sensor's noise power spectral density at different frequencies, which is the ratio between standard deviation of the voltage signal and square root of equivalent noise bandwidth. It has no dependence on the settings of the lock-in amplifier.

Figure 4A:
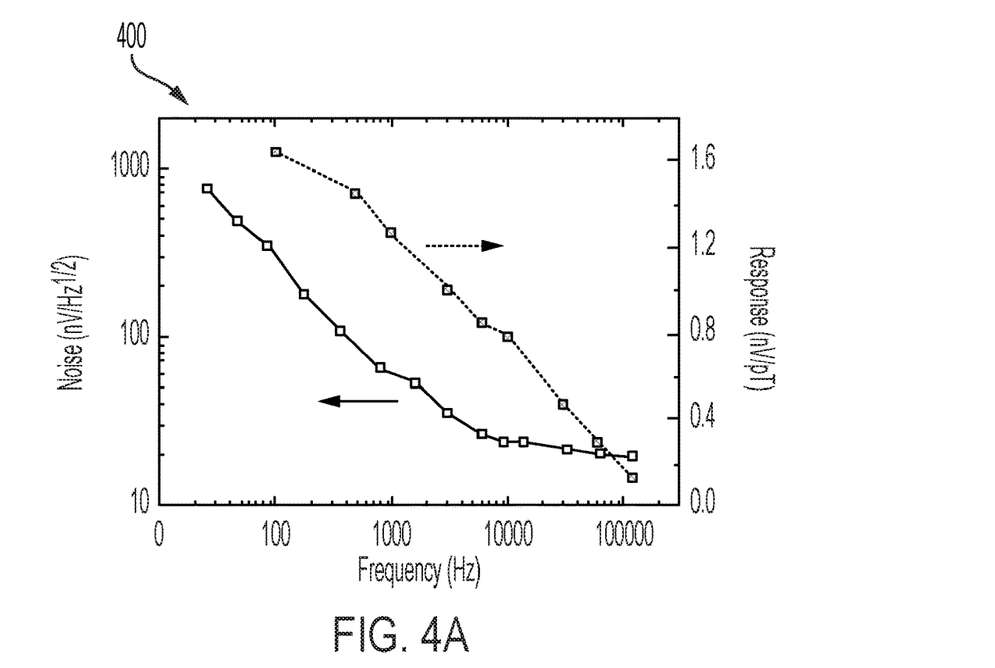
FIG. 4A is an exemplary graph of noise spectrum and sensor response as a function of frequency for an MTJ sensor with double-staged MFCs.

FIG. 4A illustrates an exemplary graph 400 of a response and noise of MTJ sensor from 0.1 to 120 kHz. While the response decreases monotonically as frequency increases, the noise decreases first and saturates at around 10 kHz. The noise power spectral density of each MTJ can be characterized by:

$$S_V(V^2/Hz) = 2eVR\coth\left(\frac{eV}{2k_BT}\right) + \frac{\alpha V^2}{Af^\gamma}$$

where V is the bias voltage on the junction, R is junction resistance, and A is junction area. The first term is a combination of the Johnson and shot noise and does not have any frequency dependence, while the second term is the electric 1/f noise, characterized by Hooge-like parameter alpha and exponent gamma ≈1 For MTJ sensor of the present invention, 1/f noise dominates at frequency lower than 10 kHz, and the white noise level shows good consistency to the prediction from the Johnson and shot noise.

Figure 4B:
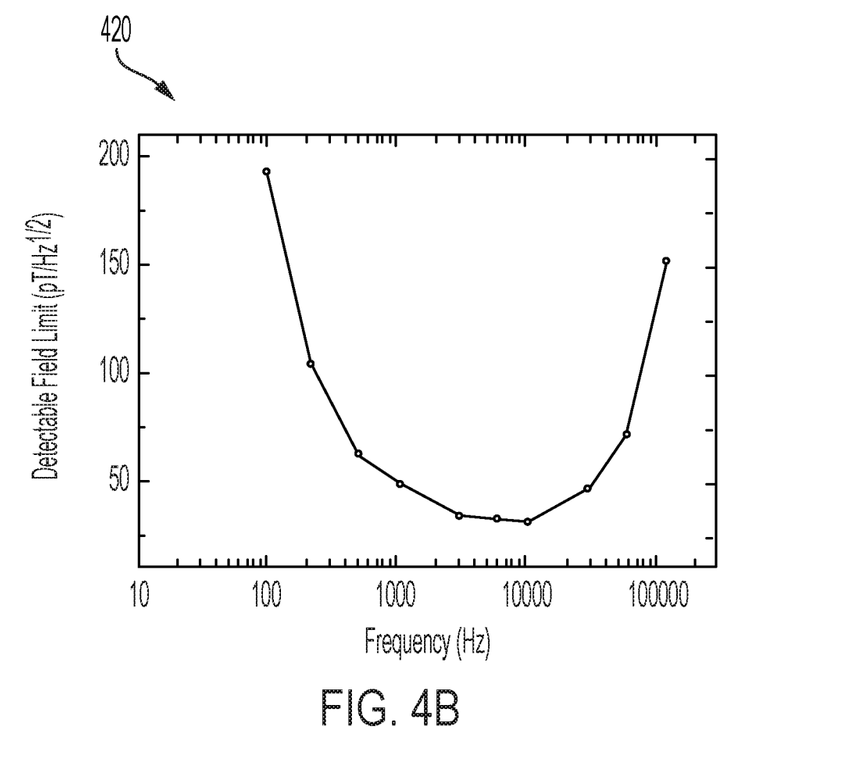
FIG. 4B is an exemplary graph of setectable field limit calculated based on FIG. 4A as a function of frequency up to 100 kHz.

From the response and noise spectrum of MTJ sensor, we can calculate its detectable field limit as the ratio between noise and response. FIG. 4B illustrates an exemplary graph 420 of this quantity from 0.1 to 120 kHz. At low frequency, the rise of 1/f noise dominates over the increment of response, giving rise to a high detectable field limit of at 100 Hz; at high frequency, noise level becomes frequency-independent while response continues to drop. Therefore the optimal performance of MTJ sensor is achieved at intermediate frequencies (3 to 30 kHz) with detectable field limit goes as low as. In previous sensors with MFCs, sensor's response has been assumed frequency-independent and determined from transfer curve under DC magnetic field. However the decrease in sensor response at higher frequency would lead to an increase of the detectable field limit. Therefore our method of direct measurement of high frequency sensor response is necessary in characterizing the full performance of the MTJ sensor.

In summary, the double-staged magnetic flux concentrators of the present invention enhance the magnetic field sensitivity of the MTJ sensors to an unprecedented level. The first stage MFC is a shaped CoZrNb thin film, which we have optimized the fabrication process to acquire a field amplification factor of 18.8. This on-chip MFC is incorporated naturally on the MTJ sensor chip with a small footprint. The second stage MFC uses a "soft" alloy of $Ni_{77}Fe_{214}Cu_5Mo_4$ in thin sheet, which is larger in size and in contact with the on-chip MFC. This external MFC has an even larger amplification factor of 30.8. Together with a total amplification of 516.9, the MTJ sensor of the present invention with dual MFCs sports a MR sensitivity of 775.4%/Oe and an ultimate detectable field limit of at 10 kHz.

It would be appreciated by those skilled in the art that various changes and modifications can be made to the illustrated embodiments without departing from the spirit of the present invention. All such modifications and changes are intended to be within the scope of the present invention except as limited by the scope of the appended claims.

What is claimed is:

1. A magnetic tunneling junction sensor comprising:
   a free ferromagnetic layer of material comprising CoFeB;
   a pinned ferromagnetic layer of material comprising CoFeB, the free ferromagnetic layer and the pinned ferromagnetic layer separated by a thin insulating layer of material comprising MgO through which electrons can tunnel;
   an oxidized silicon wafer, the free ferromagnetic layer, thin insulating layer and the pinned ferromagnetic layer deposited on the oxidized silicon wafer; and
   extrinsic magnetic flux concentrators that amplify external magnetic fields, the extrinsic magnetic flux concentrators comprising an on-chip MFC stage and an external MFC stage.

2. The magnetic tunneling junction sensor of claim 1 wherein the on-chip MFC stage comprises a pair of trapezoids made of $Co_{88}Zr_4Nb_8$(CoZrNb) film.

3. The magnetic tunneling junction sensor of claim 2 wherein the pair of trapezoids is separated by a gap.

4. The magnetic tunneling junction sensor of claim 3 wherein the gap is 30 μm.

5. The magnetic tunneling junction sensor of claim 1 wherein the external MFC stage comprises a pair of macroscopic flux concentrators.

6. The magnetic tunneling junction sensor of claim 5 wherein the pair of macroscopic flux concentrators comprise a bulk metallic sheet of $Ni_{77}Fe_{14}Cu_5Mo_4$ alloy.

7. The magnetic tunneling junction sensor of claim 5 wherein a thickness of the bulk metallic sheet of $Ni_{77}Fe_{14}Cu_5Mo_4$ alloy is 0.5 mm.

8. A method comprising:
   depositing a bottom ferromagnetic layer on an oxidized silicon wafer using magnetron sputtering;
   depositing an insulating layer on the bottom ferromagnetic layer using magnetron sputtering; depositing a top ferromagnetic layer on the insulating layer using magnetron sputtering;
   adding a pattern using photolithography; and
   adding a pair of magnetic flux concentrators, the magnetic flux concentrators comprising an on-chip MFC stage and an external MFC stage.

9. The method of claim 8 wherein the external MFC stage comprises a pair of macroscopic flux concentrators.

* * * * *